United States Patent [19]

Multedo et al.

[11] Patent Number: 4,903,032
[45] Date of Patent: Feb. 20, 1990

[54] METHOD AND DEVICE FOR PROTECTION AGAINST A JAMMER IN A RADIO STATION COMPRISING SEVERAL CHANGE-OVER ANTENNAS AND THEIR USE FOR THE MAKING OF RADIOGONIOMETERS

[75] Inventors: Gilbert Multedo, Bouffemont; Jean-Claude Balin, Paris, both of France

[73] Assignee: Thomson-CSF, Paris, France

[21] Appl. No.: 215,709

[22] Filed: Jul. 6, 1988

[30] Foreign Application Priority Data

Jul. 7, 1987 [FR] France .................. 87 09624

[51] Int. Cl.[4] .................. G01S 5/04; H04K 3/00
[52] U.S. Cl. .................. 342/441; 342/19
[58] Field of Search .................. 342/19, 17, 428, 431, 342/433–436, 440, 441

[56] References Cited

U.S. PATENT DOCUMENTS

| 4,220,954 | 9/1980 | Marchand | 342/433 |
| 4,481,519 | 11/1984 | Margerum | 342/434 |

FOREIGN PATENT DOCUMENTS

| 0184486 | 6/1986 | European Pat. Off. | 342/441 |
| 2820167 | 5/1979 | Fed. Rep. of Germany | 342/434 |
| 2613107 | 9/1979 | Fed. Rep. of Germany | 342/435 |

OTHER PUBLICATIONS

Electronics Letters, vol. 21, No. 20, 26 Sep. 1985, pp. 921-922, Hitchin, Herts, GB; T. B. Vu et al: "Minimisation of Phase Error in Digitally Controlled Attenuator" *En entier*.

Primary Examiner—Thomas H. Tarcza
Assistant Examiner—Gregory C. Issing
Attorney, Agent, or Firm—Cushman, Darby, Cushman

[57] ABSTRACT

The method consists in the step of masking the energy influence of the aliased spectrum of a jammer received in the useful band of each of the reception channels of a radio station during a determined time interval surrounding the change-over instant of each antenna. The masking is done either by means of attenuators with diodes placed at the input of each of the reception channels and controlled during the determined time interval or by memorizing, at least during the time interval, the gain of the intermediate frequency amplifiers before the change over takes place, by opening the automatic gain control loop of the intermediate frequency amplifiers to stabilize the gain of each amplifier, during the change over, at its memorized gain value.

10 Claims, 5 Drawing Sheets

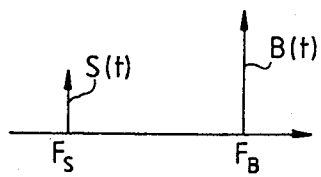
FIG.1
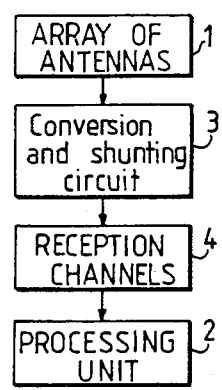
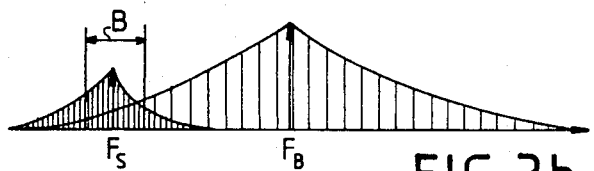
FIG.3a
FIG.3b
FIG.2
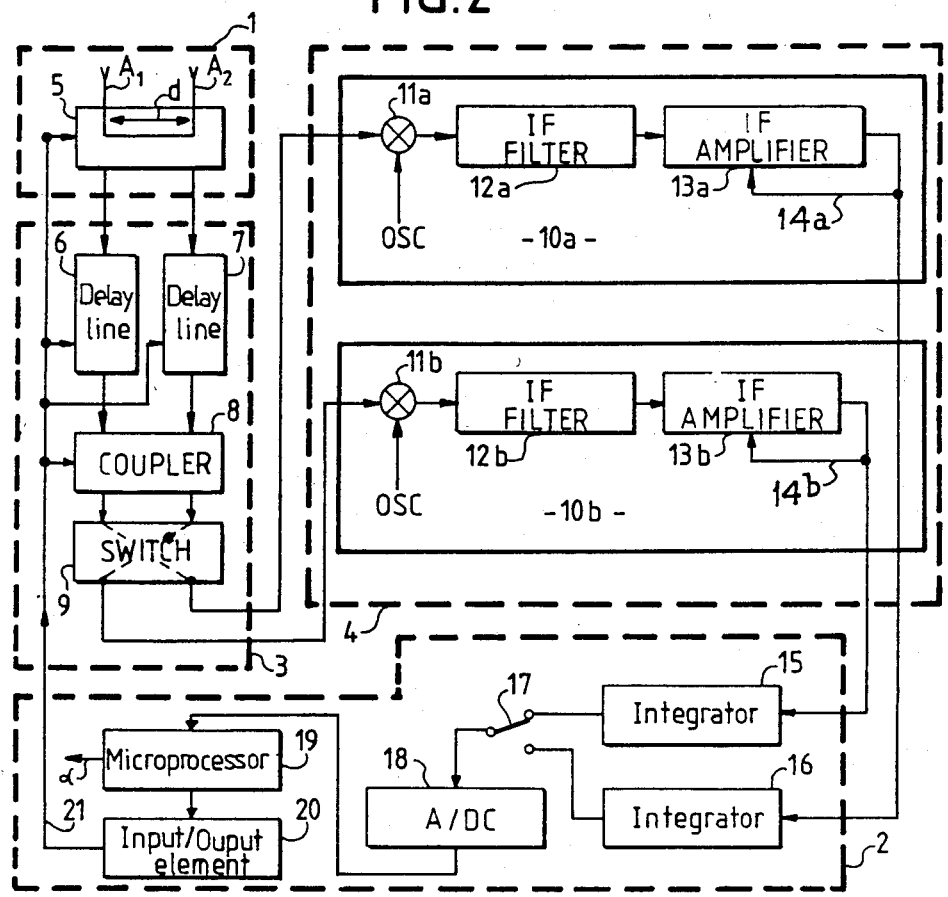

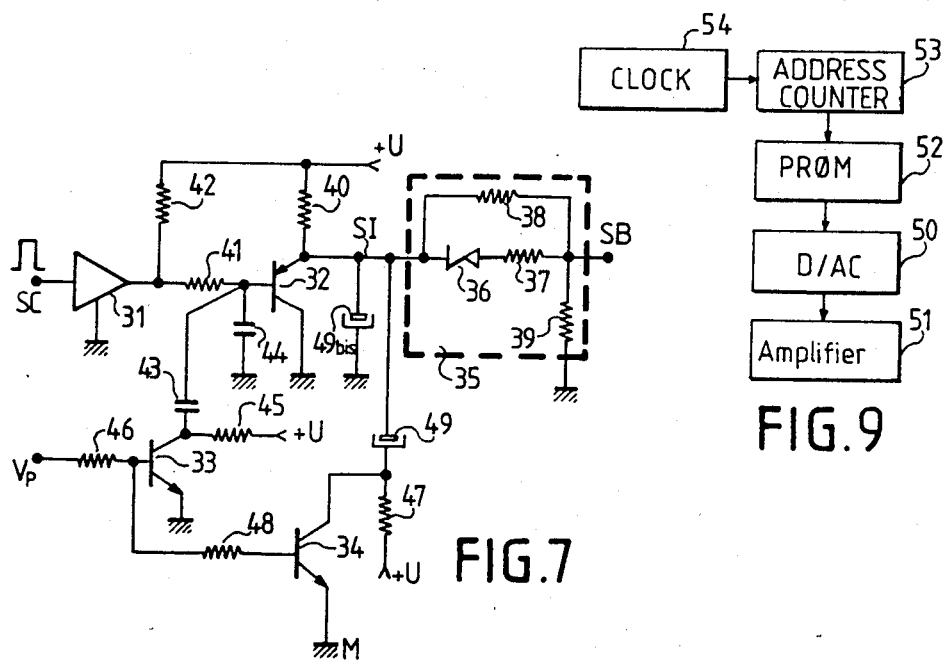
FIG.7
FIG.9
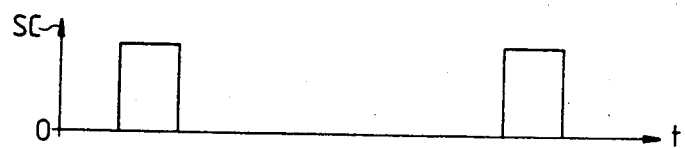
FIG.8a
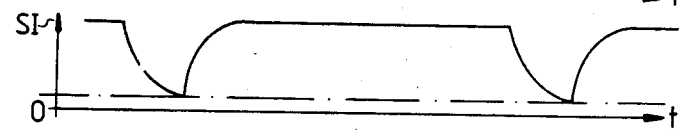
FIG.8b
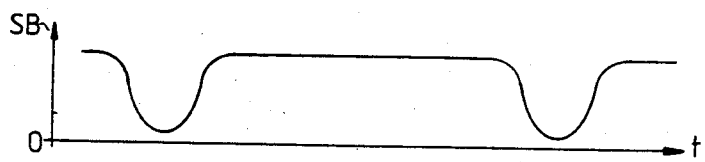
FIG.8c
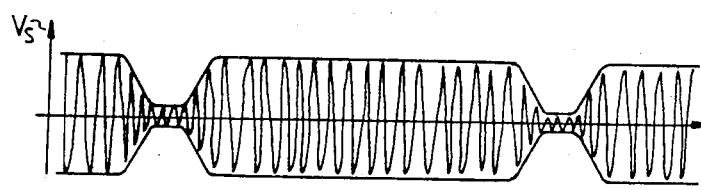
FIG.8d

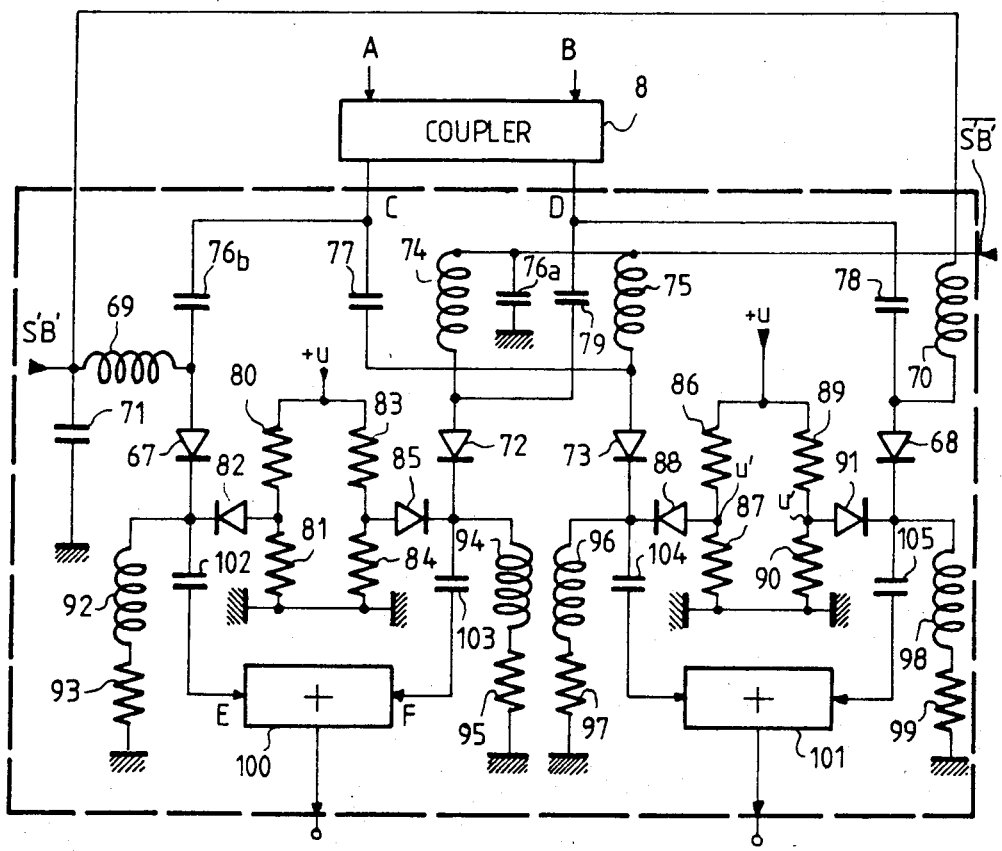
FIG_10
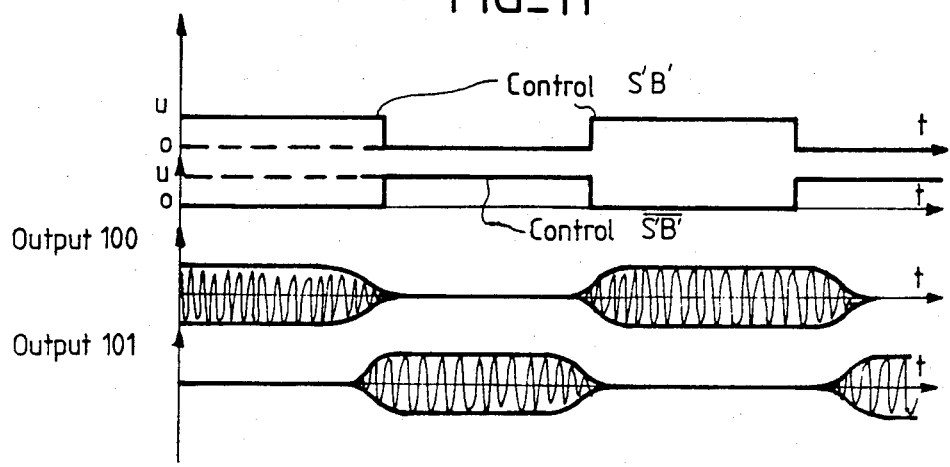
FIG_11

METHOD AND DEVICE FOR PROTECTION AGAINST A JAMMER IN A RADIO STATION COMPRISING SEVERAL CHANGE-OVER ANTENNAS AND THEIR USE FOR THE MAKING OF RADIOGONIOMETERS

BACKGROUND OF THE INVENTION

1. Field of the Invention

The invention concerns a method and device for protection against a jammer in a radio station having several change-over antennas and their use for the making of radiogoniometers.

2. Description of the Prior Art

To ensure the minimum quality of communications in radio-electrical transmission systems or, again, for reasons related to manufacturing costs, it is common practice to use only a limited number of reception channels, which are smaller than the number of antennas belonging to the station, by changing over the reception channels to the most appropriate antennas, depending on propagation circumstances or, again, on requirements for processing the received data. This is especially the case for diversified radioelectrical transmission systems and for radiogoniometers working in a sequential mode. In the former case, for example, the changing over is done on the antenna most suited to the tropospheric or ionospheric propagation conditions in the latter case, to limit manufacturing costs, the processing unit responsible for computing the angle of arrival of the electromagnetic waves performs antenna change-over operations to undertake interferometrical measurements on a limited number of reception channels.

The counterpart of this is that these change-over operations introduce spectral aliasing due to the convolution of the spectrum of the signals present at the antenna before filtering by the reception channel and the convolution of the spectrum of the change-over signal. This is all the more troublesome as, when there is a jammer, i.e. a transmitter having its frequency locked into frequency close to the station's operating frequency, a part of the spectrum resulting from the convolution of the change-over signal with the signal of the jammer penetrates the reception frequency band. To the extent that the power of the jammer is far greater than that of the useful signal, that portion of the power of the jamming signal which is aliased in the useful band may be greater than the power of the signal. In these circumstances, the processing of the received signals becomes disturbed or perhaps even impossible.

SUMMARY OF THE INVENTION

The aim of the invention is to remove the above-mentioned drawbacks.

To this end, an object of the invention is a method for protection against a jammer in a radio station comprising several antennas which can be changed over to one or more reception channels, said method consisting in the masking of the energy influence of the aliased spectrum of the jammer received in the useful band of each of the reception channels during a specified time interval surrounding the instant at which an antenna is changed over to a reception channel.

Another object of the invention is a device to implement the above-mentioned method and to use the above-mentioned method and/or device to the making of radiogoniometers.

BRIEF DESCRIPTION OF THE DRAWINGS

Other features and advantages of the invention will emerge below from the following description made with reference to the appended drawings, of which:

FIG. 1 is a general block diagram of a radio station using a radiogoniometer;

FIG. 2 is a schematic diagram of a radiogoniometer working in sequential mode;

FIGS. 3a and 3b are graphs ilustrating the formation of aliasing spectra in a reception channel;

FIGS. 8a to 8d are graphs illustrating the working of the attenuators shown in FIGS. 5a and 5b when they are controlled by the control circuit shown in FIG. 7;

FIG. 9 shows a second embodiment of a circuit for controlling the attenuators of FIGS. 5a and 5b;

FIG. 10 shows an embodiment of a change-over switch enabling the permutation of the output channels of the hybrid coupler of the radiogoniometer of FIG. 2;

FIG. 11 is a graph to illustrate the working of the change-over switch of FIG. 10;

DESCRIPTION OF THE PREFERRED EMBODIMENT

Figure 4A:
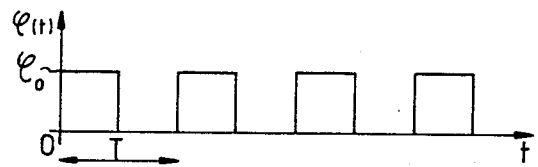
FIGS. 4 a, 4b and 4c are graphs that illustrate the working of a first implementation of the method according to the invention.

The invention is described below in a radiogoniometry application using radiogoniometers working in sequential mode. A detailed example of this application, which is taken up below in the depictions of FIGS. 1 and 2, can be found in the French patent application No. 2 573 538 filed on behalf of the Applicant. The radiogoniometer represented according to the schematic diagram of FIG. 1 has an array 1 of antennas, which is coupled to a processing unit 2 through circuits 3 for the conversion and shunting of the high-frequency signals given by the antennas of the array 1 and a set of reception channels 4. The processing unit computes the angle of arrival $\alpha$ of the electromagnetic waves with respect to a fixed cardinal direction of geographic space, for example the direction of the earth meridien from the place where the array of antennas is located. Details of embodiments corresponding to this architecture are shown in FIG. 2 where the elements corresponding to those of FIG. 1 are shown inside dashes bearing the same references.

According to the representation of FIG. 2, the array of antennas 1 consists of an interferometrical base 5 which is coupled to a set of reception channels 4 by means of delaying lines 6 and 7, a quadrature hybrid coupler 8 and a change-over switch 9, the set of elements 6 to 9 forming the circuit 3 of FIG. 1. All the reception channels comprise two channels consisting of two receivers 10a and 10b each comprising a frequency change-over device 11a and 11b respectively, an intermediate frequency filter, 12a and 12b respectively, an intermediate frequency amplifier 13a and 13b respectively. A feedback link, 14a and 14b respectively, provides for the automatic gain control (AGC) of the amplifiers, 13a and 13b. The processing element 2 is coupled to the outputs of two receivers 10a and 10b and has two integrators 15 and 16 alternatively coupled by means of a multiplier 17 to an analog/digital converter 18. A microprocessor 19 is coupled to the output of the analog/digital converter 18 to compute the angle of arrival α of the electromagnetic waves on the interferometrical base of antennas 5 with respect to the geographical direction chosen as a reference. An input/output element 20 sends change-over orders on a control line 21, firstly, to the change-over switch 9 and to change-over switches (not shown) for changing over weights of delay lines 6 and 7 and antennas 5.

If it is assumed, to simplify the description, that the interferometrical base or array of antennas 5 consists of only two antennas $A_1$ and $A_2$, at a distance of d from one another, the phase deviation $\Delta\rho$ of the signals given by the two antennas verifies the relationship:

$$\Delta\phi = \frac{2\pi d}{\lambda} \cdot \sin\alpha \tag{1}$$

where λ designates the wavelengths of the signals.

The signals $S_A$ and $S_B$ obtained at the outputs of the delay lines 6 and 7 verify the relationships:

$$S_A(t) = S_{(t)} \cdot \text{Exp } j \ (\omega_0 t + \rho_{(t)} + \omega_0 \tau_A) \tag{2}$$

$$S_B(t) = S_{(t)} \cdot \text{Exp } j \ (\omega_0 t + \rho_{(t)} + \omega_0 \tau_B + \Delta\rho) \tag{3}$$

wherein:

$S_{(t)}$ designates the amplitude and $\rho_{(t)}$ designates the inherent phase of the received radio-electrical signals, $\omega_o$ designates the pulsing of the carrier wave and $\tau_A$, $\tau_B$ designate the delay constants of the delay lines 6 and 7.

The signals $S_C(t)$ and $S_D(t)$ respectively obtained at the outputs of the hybrid coupler 8 have the shape:

$$S_C(t) = [S_A(t) - j S_B(t)] \cdot \frac{1}{\sqrt{2}} \tag{4}$$

$$\text{and } S_D(t) = [S_B(t) - j S_A(t)] \cdot \frac{1}{\sqrt{2}} \tag{5}$$

The moduli of these signals are:

$$|S_C(t)| = S_{(t)} \sqrt{1 - \sin\psi} \tag{6}$$

$$\text{and } |S_D(t)| = S_{(t)} \sqrt{1 + \sin\psi} \tag{7}$$

$$\text{or } \psi = \Delta\phi - \omega_0(\tau_A - \tau_B) \tag{8}$$

The outputs of the hybrid coupler 8 are alternatively connected to the inputs of the first and second receivers $10_a$ and $10_b$, with a fixed time period rate T. During a first half-period T/2, the receiver $10_a$ receives the signal $S_C(t)$ while the other receiver $10_b$ receives the signal $S_D(t)$, the application of these signals being inverted during the following half-period.

If $k_1(t)$ is the gain of the first receiver $10_a$ and if $k_2(t)$ is the gain of the second receiver $10_b$, the expressions of the energies $E_1$ and $E_2$ received by the receivers during the first half-period are respectively written as:

$$E_1 = \int_0^{T/2} K_1(t) \, S_{(t)} \sqrt{1 - \sin\psi} \cdot dt \tag{9}$$

$$E_2 = \int_0^{T/2} K_2(t) \, S_{(t)} \sqrt{1 + \sin\psi} \cdot dt \tag{10}$$

During the second half period, they are respectively written as:

$$E_1' = \int_{T/2}^{T} K_1(t) \, S_{(t)} \sqrt{1 + \sin\psi} \cdot dt \tag{11}$$

$$E_2' = \int_{T/2}^{T} K_2(t) \, S_{(t)} \sqrt{1 - \sin\psi} \cdot dt \tag{12}$$

A combination done by the processor 4, of the four energy values defined by the relationships 9 to 12, makes it possible to obtain a relationship which depends on ρ and which is cancelled out with Ψ, of the type F-1 for example, with:

$$F = \frac{E_2}{E_1} \times \frac{E_1'}{E_2'} = \frac{1 + \sin\psi}{1 - \sin\psi} \tag{13}$$

or again:

$$G = \frac{E_1'E_2 - E_1 E_2'}{\text{MAX}(E_1'E_2 E_1 E_2')} = \frac{2 \sin\psi}{1 + |\sin\psi|} \tag{14}$$

A change-over of the weights of the delay lines makes it possible, by varying $\tau_A$ and $\tau_B$, to reduce Ψ to the value 0 and to reduce $\Delta\rho$ therefrom. Through the relationship (8) we obtain:

$$\Delta\phi = \omega_0(\tau_A - \tau_B).$$

However, the main technical limit on the use of the radiogoniometer of FIG. 2 is caused by the aliasing of the spectra created by the amplitude switching achieved by the change-over of the outputs of the quadrature hybrid coupler 8 and the phase switching done by the change-over of the inputs of the antennas and the weights of the delay lines 6 and 7. These change-over operations produce a spread of the energy of the signals present in the antenna array 5 as shown in FIGS. 3a and 3b.

According to the representation of FIG. 3a, the spectrum of the input signal is limited to a useful signal with an amplitude $S_{(t)}$ and a frequency $F_S$, and a jamming signal with with an amplitude $B_{(t)}$ and a frequency $F_B$ is added to it.

A change-over to the parts upline of the radiogoniometer, before the reception channels 10a and 10b, thus gives a signal $E_{(t)}$ at the input of the reception channels with the form:

$$E_{(t)} = C_{(t)} \times (S_{(t)} + B_t) = C_{(t)} \cdot S_{(t)} + C_{(t)} \cdot B_{(t)} \tag{15}$$

where $C_{(t)}$ designates the change-over signal to which there corresponds, in the frequency range, a spectrum with the form:

$$E(f) = C(f)*S(f) + C(f)*B(f) \tag{16}$$

where * designates the convolution operator.

The result of this is that the application of the change-over signal has the effect of spreading the energy of the jammer, a part of the spectrum C(f) * B(f) being able, as shown in FIG. 3b, to penetrate the reception band B of the reception channels 10a and 10b.

This phenomenon can be made even more explicit by considering the spectrum of a pure carrier that exists for a duration T and undergoes an amplitude phase switching 10 at the instant T/2, in the way in which this switching is represented in FIG. 4a. In this case, if $$S_{(t)} = A.\text{Exp } j\omega 0^t \tag{17}$$

represents the signal of the carrier wave and $$C_{(t)} = \text{Exp } j\rho_{(t)}t \tag{18}$$

the commutation signal for which
$\rho_{(t)} = \rho_0$ in the interval $0 \leq t \leq T/2$ $\rho_{(t)} = 0$ in the interval $</2 \leq t \leq T$ the spectrum $S_{(f)}$ can be represented by a relationship having the form:

$$S_{(f)} = \tag{19}$$

$$2 \cdot \cos\left(\frac{\phi_o - \pi ft}{2}\right) \frac{\sin\left(\pi f \frac{T}{2}\right)}{\pi f} \text{Exp } j(\phi_o - \pi fT)$$

In these circumstances, a sustained change-over with a periodicity T creates a spectrum of lines around the frequency $f_0$ with an amplitude:

$$S_n = 2 \cdot \cos\left(\frac{\phi_o - \pi n}{2}\right) \frac{\sin\left(n \cdot \frac{\pi}{2}\right)}{n \cdot \pi} \tag{20}$$

for example, with $\rho_0 = \pi f_0 = f_B$, $f_S - f_B = 25$ KHz and a filter width of 8 KHz, 84 odd-numbered lines with a non-null amplitude are obtained inside the intermediate reception filter 12, n ranging between the n=421 and n=579. These lines have the following amplitude:

$$S_n = \frac{\left(\sin n \frac{\pi}{2}\right)^2}{n \frac{\pi}{2}} \tag{21}$$

and their energy varies from −56.5 decibels to −59.2 decibels as compared with the initial energy of the jammer at the frequency $f_B$. Since these lines are in phase, the total energy aliased in the filter is equal to about −39 decibels. In these circumstances, the performance values obtained would appear to be hardly acceptable, at least with respect to standards applied in radio communications where it must be considered that efficient protection against the radiation of an adjacent channel can be obtained only for energy levels of about −60 decibels to −70 decibels.

Figure 4B:
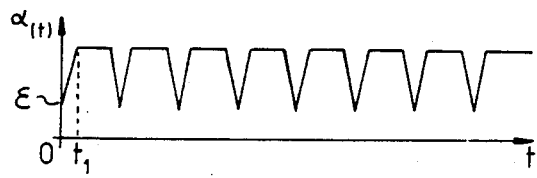

To remove this drawback, a first alternative of the method according to the invention consists in superimposing an amplitude switching with a low steepness on the phase switching at the input of the reception channels 10a and 10b by giving the change-over signal C(t) a form verifying a relationship of the type:

$$C_{(t)} = \alpha(t) \text{ Exp } j\rho(t) \tag{22}$$

in the manner shown in FIG. 4b where, in the interval $$0 \leq t \leq T_1, \alpha_{(t)} = \frac{1 - \epsilon}{t_1} t + \epsilon \left(\text{mod } k \cdot \frac{T}{2}\right)$$

In these circumstances, the obtained spectrum after aliasing has the form:

$$S_{(f)} = 2 \cos\frac{\phi_o - \pi fT}{2} \left[\epsilon \frac{\sin\pi f\frac{T}{2}}{\pi f} + \frac{1 - \epsilon}{\pi^2 F^2 t_1} \cdot \sin\pi f t_1 \cdot \sin\pi f\left(\frac{T}{2} - t_1\right)\right] \cdot \text{Exp } j(\phi_o - \pi fT) \tag{23}$$

The first term of the relationship (23) represents the spectrum of the preceding phase leap attenuated by $\epsilon$. The second term limits the reduction obtained on the phase leap, and it can be reduced only by increasing the value of t at the cost, however, of a loss in the integration time of the signal, inasmuch as the acquisition has not been done during the change-over operation. In the above conditions, and in choosing as parameters $t1 = 200\mu s$, $t1/T = 10^{-2}$ and $\epsilon = -40$ dB we obtain a variation of −82 to −88 decibels in the energy of the odd-numbered lines. The energy aliased in the filter is then equal to −66 decibels as compared with the initial energy of the jammer, thus achieving a gain of 27 decibels as compared with the straight-edged change-over of figure 4a.

Figure 4C:
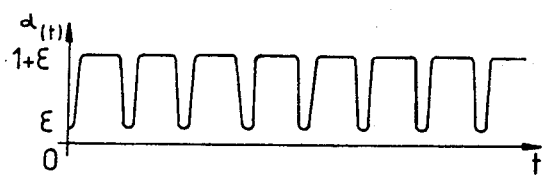

Using an even more gradual change-over of the type shown in FIG. 4c where, for $0 \leq t \leq T_1$ $$\alpha_{(t)} = 1 - \cos^2\left(\pi \frac{t}{2t_1}\right) + \epsilon\left(\text{mod } k \cdot \frac{T}{2}\right),$$

k being a positive whole number, the spectrum S(f) becomes for:

$$S_{(f)} = 2 \cdot \cos\frac{\phi_o^{-nfT}}{2} \cdot P_1 \cdot P_2 \cdot \text{Exp } j(\phi_o - \pi fT)$$

with $P_1 = \epsilon \cdot \frac{\sin\pi f \cdot \frac{T}{2}}{\pi f}$ $$\text{and } P_2 = \frac{\sin\pi f t_1 \cdot \cos\pi f\left(t + \frac{T}{2}\right) - \sin nf \cdot \frac{T}{2}}{\pi f(4\pi^2 f^2 t_1^2 - 1)} \tag{24}$$

This time, the first term is highly preponderant. The amplitude of the lines obtained varies between −96.5 and −99.2 dB, and the total energy aliased in the filter equals −79 dB.

Figure 5A:
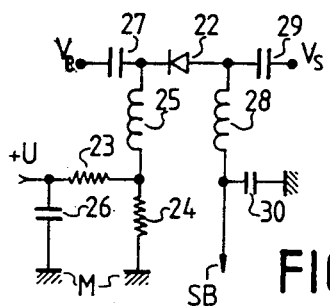
FIGS. 5a and 5b show two embodiments of attenuators to mask the influence of the aliased spectrum of a jammer in the useful band.
Figure 6A:
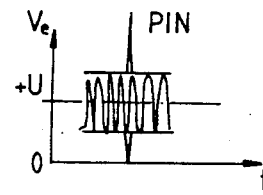
FIGS. 6a, 6b, 6c and 6d are graphs of signals representing the operation of the attenuators of FIGS. 5a and 5b.
Figure 6B:
Figure 5B:
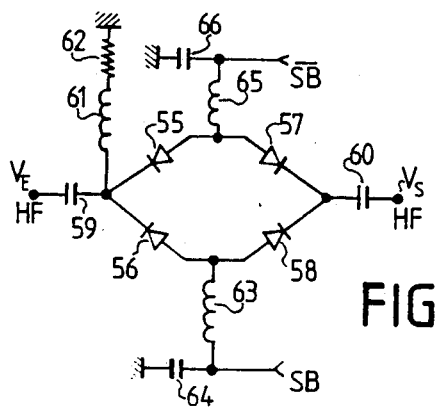
Figure 6C:
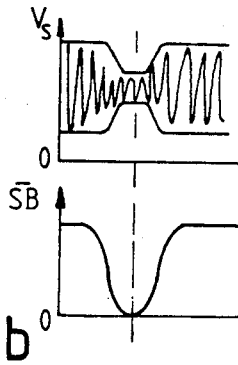
Figure 6D:

Examples of embodiments of attenuators used to obtain these results are shown in FIGS. 5a and 5b. The attenuator shown in FIG. 5a has a PIN diode 22 biased at its cathode by means of a potentiometrical divider formed by two resistors, 23 and 24, which are series connected between a potential point +U and the reference potential formed by the ground circuit M of the attenuator. The point common to the two resistors 23 and 24 is connected to the cathode of the diode 22 through a choke 25. A capacitor 26 uncouples the potential point +U from the ground circuit M. The high frequency voltage $V_e$ bearing the change-over spikes to be attenuated, which has a shape of the type shown in FIG. 6a, is applied to the cathode of the diode 22 through a capacitor 27. A control signal SB with the shape shown in FIG. 6b is applied to tha anode of the diode 22 through a choke 28 during the moment surrounding the change-over instant. The signal $V_S$ at the output of the attenuator has the shape shown in FIG. 6c. It is picked up at the anode of the diode 22 through a capacitor 29. A capacitor 30 provides for the high frequency coupling of the voltage of the control signal SB.

When the diode 22 is turned off by the signal SB, its impedance can be likened to a high resistance of about 10 to 100 kilohms shunted by a low capacitance of 0.3 to 1 picofarad. By contrast, when the diode 22 is on, i.e. when it is biased directly by the control signal SB, its impedance becomes equivalent to a very low-value series resistance, ranging between 5 and 10 ohms for example. Since the bias current needed depends on the lifetime $\tau$ of the carriers of the diode 22 compared with the period of the signal that crosses it, the quantity of energy stored by the bias current should always remain greater than the alternating energy that crosses it. Currents of about 10 milliamperes are generally enough to make the diode similar to a resistor of about 10 ohms. However, the diode 22 cannot be controlled by the signal SB by means of a signal having edges that develop along a small linear slope. This is because of the transfer characteristic of the diode 22 which, despite the control signal, tends to make the HF signal to be changed over a rectangular signal. This drawback can be removed by taking into account the fact that the dynamic resistace $R_d$ of the diode 22, in its on state, varies as a function of the current which flows through it according to a relationship with the form.

$$Rd = \frac{KT}{q} \quad \frac{1}{I^n} \quad (25) \text{ with } n \simeq 0{,}88$$

K designates the Boltzmann constant, T the absolute temperature, q the electron charge and n a coefficient. It follows from the relationship (25) that the signal $S_B$ should be given by a voltage generator governed by an exponential relationship to obtain a linear rising time of the high frequency signal $V_S$. The corresponding signal $S_B$ is shown in FIG. 6b.

A generator of this type is shown in FIG. 7. It comprises an inverting amplifier 31, a set of transistors 32, 33 and 34 and an array 35. This array 35, which is shown inside dashes, is formed by a zener diode 36 which is series-connected with a resistor 37, this zener diode 36 and this resistor 37 being shunted by a resistor 38. The common point of the resistor 38 and the resistor 37 is connected to the ground circuit M by means of a resistor 39. The transistor 32 is a PNP transistor which is connected by its transmitter to a bias voltage +U through a resistor 40, its base being series-connected at the bias point +U through two resistors 41 and 42. The common point of the two resistors 41 and 42 is connected to the output of the inverting amplifier 31. The base of the transistor 32 is also connected to the collector of the transistor 33 through a capacitor 43 and to the ground circuits M through a capacitor 44. The transistor 33 is an NPN type transistor with its collector biased at the potential point +U through a resistor 45. The base of the transistor 33 is controlled from a control voltage VP through a resistor 46. The emitter of the transistor 33 is connected to the ground circuit M. The transistor 34 is an NPN type transistor with its collector connected to the bias potential +U through a resistor 37; its emitter is connected to the ground potential and it base is connected to the base of the transistor 33 through a resistor 48. The emitter of the transistor 32 is connected to the common point of the zener diode 36 and the resistor 38, and is coupled to the collector of the transistor 34 through a capacitor 49. The collector of the transistor 34 is also connected to the ground circuit M through a capacitor 49a. The elimination signal SC to be shaped is applied to the input of the inverting ammplifier 31. Its shape is rectangular, and it is converted by the transistor 32 into a signal SI which is transmitted by its emitter. The signal SI has the shape of a signal with a logarithmic ascent and an exponential descent obtained by the charging and discharging of the capacitors 44 and 49a. The array 35 which follows the transistor 32 converts the logarithmic ascents of the signal SI into substantially exponential ascents. The signal SC and SI are shown in FIGS. 8a and 8b. The signal SB which is the signal SI converted by the array 35 is shown in FIG. 8c. The signal SB, applied to the control input of the attenuator of FIG. 6a, is used to obtain an attenuation of the HF signal in the manner shown in FIG. 8d.

An alternative embodiment of the voltage generator is shown in FIG. 9. According to this alternative embodiment, the exponential relationship needed for the control of the attenuator of FIG. 6a is got from a digital/analog converter coupled with an amplifier 51. The digital/analog converter 50 is connected to a programmable read-only memory (PROM) 52 in which the excitation needed by the digital/analog converter 50 is programmed. An addresses counter 53, driven by a clock 54, is used to address the binary words contained in the PROM 52 to excite the digital/analog converter 50. With an 8-bit digital/analog converter, for example, it is thus possible to obtain 256 echelons which will be filtered by the amplifier 51. This approach, which is more efficient than the similar approach of FIG. 7 calls, however, for very great filtering precautions, since the filtering has to be modified at each change in slope.

Finally, the embodiment of the attenuator of FIG. 5a is not unique, and a two-channel shunting circuit is also used, of the type shown in FIG. 5b using a set of four bridge-mounted PIN diodes 55, 56, 57 and 58. This assembly is used in the delay lines to change over the phase weights. Here, the aliasing of the spectrum is reduced to the minimum by the ascent of the signal on a low steepness at the change-over instant, thus preventing the generation of spikes or change-over pulses and giving a spectral response according to the relationship (23). The control signal SB and its complementary signal SB are each applied to one end of a diagonal of the bridge through inductances 63 and 65, and the input signal VE and output signal VS are respectively picked up at the other end of the second diagonal of the bridge through 59 and 60. The cathodes of the diodes 55 and 56 are coupled to the ground of the attenuator through an inductance 61 and a resistor 62 which are series connected. The point of application of the signal SB is coupled to the ground through a capacitor 64 and the point of application of the signal $\overline{SB}$ is coupled to the ground through a capacitor 66.

Another assembly shown in FIG. 10, with properties similar to that of the circuit of FIG. 5b, can also be used at the output of the hybrid coupler 8 in quadrature to make the change-over switch 9. As above, a change-over switch with a small slope is used to prevent spectral aliasings. This change-over takes place at the outputs C and D of the coupler 8 under the control of the signals S'B' and $\overline{S'B'}$ coming from a signals generator with exponentially rising edges of a type similar to those shown in FIGS. 7 and 9. The signals S' B' and $\overline{S'}$ $\overline{B'}$ shunt the signals leaving the outputs C and D of the coupler 8. The signals leaving the change-over switch can be applied without distinction to one or two receivers $10_a$ or $10_b$ to facilitate the processing of the signals coming from complex modulation. The signal S'B' is applied to the anodes of the diodes 67 and 68 through inductors 69 and 70 respectively. The point of application of the signal S'B' to the inductors 69 and 70 is coupled to the ground through a capacitor 71. The signal $\overline{S'B'}$ is applied to the anodes of diodes 72 and 73 through inductors 74 and 75 respectively. A capacitor $76_a$ couples the point of application of the signal $\overline{S'B}$ to the inductances 74 and 75. The anodes of the diodes 67 and 73 are also coupled to an output C of the hybrid coupler 8 through capacitors $76_b$ and 77 respectively. Similarly, the anodes of the diodes 68 and 72 are coupled to an output D of the hybrid coupler 8 through the capacitors 78 and 79 respectively. The cathode of the diode 67 is connected to the common point of two series-mounted resistors through a diode 82, said diode 82 having its anode connected to the common point of two resistors 80 and 81 and having its cathode connected to the cathode of the diode 67. Also, the cathode of the diode 72 is connected to the common point of two resistors 83 and 84, series connected through a diode 85, the diode 85 having its anode connected to the common point of two resistors 83 and 84 and its cathode connected to the cathode of the diode 72. Also, the cathode of the diode 73 is connected to the common point of two resistors 86 and 87, series connected through a diode 88, the diode 88 having its anode connected to the common point of the two resistors 86 and 87, and its cathode connected to the cathode of the diode 73. Finally, the cathode of the diode 68 is connected to the common point of two resistors 89 and 90, which are series mounted, through a diode 91, the diode 91 having its anode connected to common point of the two resistors 89 and 90, and its cathode connected to the cathode of the cathode of the diode 68. The common points of the diodes 67, 82; 72, 84; 73, 88; 68, 91 are respectively coupled to the ground circuit M through a series-mounted inductance and resistor respectively marked 92, 93; 94, 95; 96, 97; 98, 99. Adder circuits 100 and 101 with two operand inputs form the output elements of the change-over switch 9. The adder circuit 100 has its two operand inputs connected, firstly, to the common point of the two diodes through a capacitor 102 and, secondly, to the common point of two diodes 72 and 75 through a capacitor 103. Similarly, the adder circuit 101 has its two operand inputs connected, firstly, to the common point of the two diodes 73 and 88 through a capacitor 104 and, secondly, to the common point of the two diodes 68 and 91 through a capacitor 105.

Referring to the graphs of FIG. 11, the working of the change-over switch 9 is given below, assuming that the signal S'B' is, according to a first cycle, applied to the diodes 67 and 68 with a potential level greater than a potential level U' existing at each common point of the pair of resistors 80, 81; 83, 84; 86, 87; 89, 90 mounted as a potentiometrical divider. On this assumption, the signal $\overline{S'B'}$ is at the 0 volt potential. The diodes 67 and 68 are then on and the diodes 72 and 73 are off. The diodes 85 and 88, the anodes of which are carried to the potential U', are on.

At the following cycle, the signal $\overline{S'B'}$ is positive and has a potential level which is higher than the potential U'. The signal S'B' being null, the diodes 72 and 73 are on and the diodes 67 and 68 are off. The outputs of the adders 100 and 101 are thus alternately connected to the outputs C and D of the coupler 8. According to this mode of embodiment, the impedances of the diodes 85 and 88, taken in their "on" direction, and the impedances of the potentiometrical dividers which give the voltage U' should be computed so that the resulting impedance enables the matched closing of the off inputs F and G of the adders 100 and 101.

The circuit of FIG. 10 is, naturally, not a single one. In particular, a simplified assembly which is less flexible while being less efficient can be made by eliminating the adders 100 and 101, the diodes 82, 85, 88 and 91 as well as the potentiometrical dividers which give the voltage U'. The cathodes of, firstly, the diodes 67 and 72 and, secondly, the diodes 73 and 67, will then form the outputs of the change-over switch 9 and will be then connected respectively to the ground circuit M through, firstly, the inductance 92 and the resistor 99. The advantage that can be obtained is then a gain of 3 dB on the insertion losses.

Figure 12:
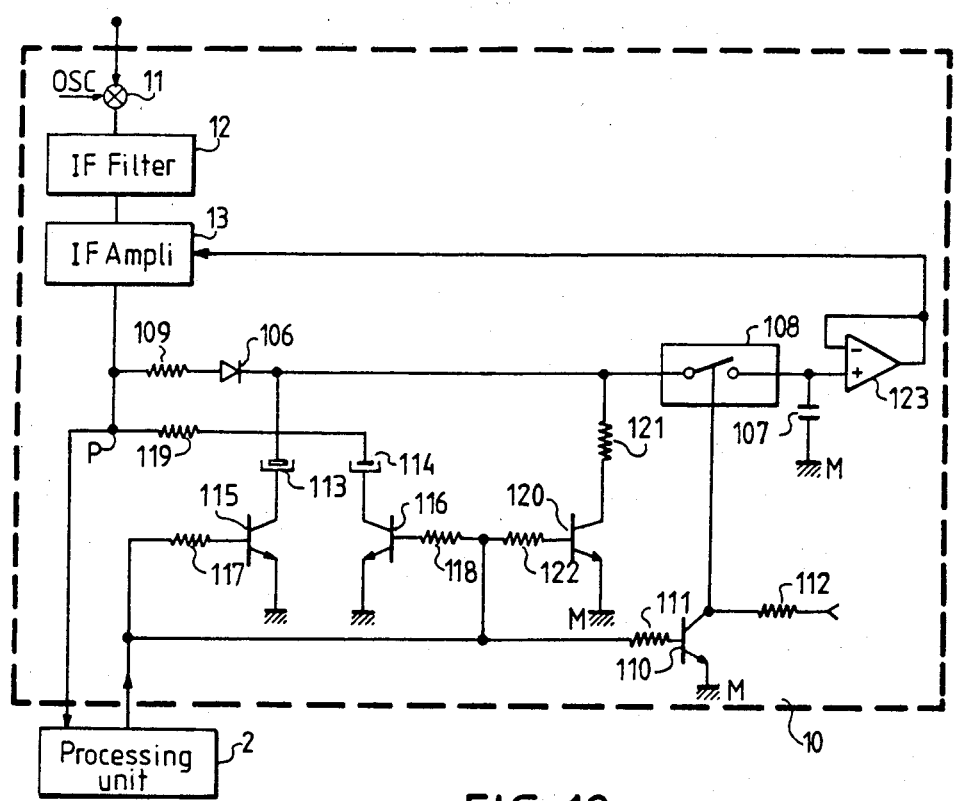
FIG. 12 shows a second embodiment of the method according to the invention.

Finally, another way of eliminating the aliasing spectrum according to the invention is shown in FIG. 12. Unlike the first method, which is derived from a spectral analysis of the change-over operation and wherein it is sought to implement a technique to reduce the spread of the spectrum caused by the change-over operation to the minimum, the method implemented in FIG. 10 results from a temporal approach to the aliasing phenomenon. In this case it can be considered that the aliasings, which are due to the jammer, are expressed in the form of "spikes" or change-over pulses which are superimposed on the useful signal obtained at the output of the intermediate frequency amplifier in each reception channel. These change-over spikes are present for a significant period of pulse responses of the intermediate frequency filter 12 of each reception channel. Their amplitude signifies aliasing lines contained in the filter 12 of each receiver, and their repetition, in the case of periodic phase leaps, causes the automatic gain control device 14 of the receivers to be sensitized on them. This phenomenon is all the more true as the reception channel has an automatic gain control device with a de-sensitization constant $T_d$ shorter than the change-over period T and a re-sensitizing constant $T_1$ which is very long as compared with the change-over period. This phenomenon can be turned to advantage, according to a second alternative embodiment of the invention, by memorizing the gain of the intermediate frequency amplifier 13 before the change-over instant to prevent it from varying during the pulse response of the intermediate frequency filter 12 to the change-over spikes.

A corresponding device, which can be positioned in each of the reception channels, is shown in FIG. 12 where the elements corresponding to those that form each reception channel of FIG. 2 are shown with the same references and where, unlike in FIG. 2, each reception channel 10 comprises, in addition to the elements 11, 12 and 13, the elements 106 to 123 which are placed in the gain control loop 14, between the output and input of the gain control of the intermediate frequency amplifier 13. The level of the signal obtained at the output of the amplifier 13 is detected by a diode 106 and a capacitor 107 which are series connected between the output of the amplifier 13 and the ground M of the circuit through a current switch 108 and a resistor 109. The resistor 109 connects the output of the amplifier 13 to the anode of the diode 106 and the switch 108 connects the cathode of the diode 106 to the the end of the capacitor 107, the opposite electrode of which is connected to the ground.

The current switch 108 is controlled by a transistor 110 biased by two resistors 111 and 112. Two capacitors 113 and 114 also connect the cathode of the diode 106 to the ground circuit M through two current switches 115 and 116 formed by two transistors controlled on their base by the processing unit 2 through two resistors 117 and 118. A resistor 119 also connects the cathode of the diode 67 to the output of the amplifier 13. A current switch 120, formed by a transistor, connects the cathode of the diode 106 to the ground circuit M through a resistor 121 to discharge the capacitor 107 when the current switch is on, i.e. when the base of the transistor is controlled through a resistor 122 by the processing unit 2. The common point of the capacitor 107 and the current switch 108 is connected to an input marked "+" of a differential amplifier 123, mounted as an impedance matching device. The output of the amplifier 123 is connected to the gain control input of the amplifier 17. Thus, the amplifier 123 enables, with the capacitor 107, the memorizing of the feedback voltage when the gain control loop 14 is opened by the current switch 108 and the control, under low impedance, of the amplifier 13 gain. The resistor 109 and the diode 106 form, with the capacitors 107 and 114, the de-sensitization time constant (the load of the capacitors 107 or 114). The resistor 119 forms, with the capacitrs 107 and 114, the re-sensitization time constant, enabling the discharge of the capacitors 107 or 114 through the resistor 119 when the diode 106 is off.

The working of the circuit is described below, assuming an initial state where the switches 108 and 120 are closed, enabling the discharge towards the ground circuit M of the capacitors 107 and 114. The gain of the amplifier is then at its maximum.

The threshold for the triggering of the amplifier 13 on a signal applied to its input by the output of the intermediate frequency 12 must, however, be set by any means (not shown) to prevent saturations on the signals of noises applied to the input of the amplifier 13 when there is no signal and to provoke, on the contrary, the saturation of th amplifier 13 as soon as a signal goes beyond this threshold. The processing unit 2 selects the time constant desired by the load of the capacitors 107 and 114 (current switches 110 and 116 closed). To eliminate the action of the capacitor 113 during the loading of the capacitors 107 and 116, the switch 115 is open. The current switch 110 is then open and the switch 108 remains closed. There is then a de-sensitization of the amplifier 13 during a period of time determined by the time constant formed by the resistor 109 and the diode 106 which charge the capacitor 107 and the selected capacitor 114. As soon as the charging of the capacitors is completed, namely after the time $t_0$ equal to about twice the de-sensitization time constant, there is an opening of the switch 108. The gain of the amplifier 13 is then stabilized on the transmission received at the instant $t_0$ through the voltage memorized at the terminals of the capacitor 107 which is discharged only very weakly in the very high input impedance of the amplifier 123. The outputs of the hybrid coupler 8, the weights of the phase of the delay lines 6 and 7 and the antennas shown in in FIG. 2 can then be changed over to enable the convergence of the computation of the value of $\Delta\Psi$ towards zero. The change-over spikes then remain without effect on the automatic gain control of the amplifiers 13 of each reception channel, thus causing no loss of sensitivity in the receivers.

The same process can then be reiterated at each new goniometrical measurement. However, it is still possible to consider another mode of operation when the measurements are extended for relatively long durations to make it possible, especially if there is a drop in the signal at the input of the reception channels, to match the device so that data relating to phase deviation measurements is not validated.

In this case, it is desirable that the automatic gain control device of the intermediate frequency amplifiers should be capable of following the variations in the input signal with short re-sensitization constants. It then suffices to see to it that, before any change-over, the processing unit 2 opens the loop 14 and closes it again after a period slightly greater than the pulse response of the filter 12.

What is claimed is:

1. A method for protection against a jammer in a radio station comprising several antennas which can be changed over to one or more reception channels, comprising the steps of:
    determining a temporal window centered on a time when the antennas are changed over from one to another; and
    masking an energy influence of the aliased spectrum of the jammer, received in the useful band of each of the reception channels during a specified time interval surrounding the instant at which an antenna is changed over to a reception channel by attenuating, in each of the channels, the signal received from an antenna in said temporal window centered on the change-over instant, the attenuation ratio varying substantially linearly with time near each of the ends of the window, passing through a maximum value in the middle of the window.

2. A method according to claim 1 wherein the attenuation ratio varies according to a relationship having the form:
    $1-\cos^2(\pi t/2t_1)$ where $2t_1$ is equal to the length, in time, of the window.

3. A method according to claim 1 wherein the electrical gain of each of the reception channels is stabilized during the change-over on the value of their gain before the change-over.

4. A protection device against a jammer in a radio station comprising several antennas which can be switched over to one or more reception channels, comprising, in each reception channel an attenuator having at least one diode to oppose passage of the signal in the reception channel, said attenuator having an attenuation ratio varying as a function of the time t according to a relation of the form $1-\cos^2(\pi t/2t_1)$ where $2t_1$ is a predetermined time interval, the opening of said attenuator being controlled by a generator of pulses with exponential fronts.

5. A protection device against a jammer in a radio station having several antennas which can be switched over to one or more reception channels, comprising at least one shunting circuit with two channels to execute delays or phase hopping in the reception channels according to a first relationship of the form $1-\cos^2(\pi-t/2t_1)$ to perform the change-over in a first direction and according to a second relationship of the form $\cos^2(\pi-t/2t_1)$ to perform the change-over in a opposite direction, the shunting circuit being controlled by signals with exponential fronts.

6. A device according to claim 5 further comprising a current switch coupled to at least one capacitor to memorize the electrical gain of each reception channel before each change over and to control the gain of each reception channel at the value of the gain memorized in the capacitor during the change over.

7. A sequential radiogoniometer comprising:
an array of antennas for generating high-frequency signals;
a processing unit coupled to said antennas;
means for conversion and shunting of the signals from the antennas, in series with a set of reception channels, said processing unit for controlling the change over of the array of antennas and the conversion and shunting circuits, to ensure the computation of the angle of arrival, of the electromagnetic waves at the arrays of antennas, with respect to a determined geographical direction of the space in which the array of antennas is located, said conversion and shunting circuit being formed by a set of delay lines coupled to the transmission channels through a hybrid coupler in quadrature and a change-over switch, wherein the change-over switch comprises a single or double shunting circuit with diodes to couple the outputs of the hybrid coupler in quadrature alternatively with the inputs of all the reception channels and to reduce spectral aliasing to the minimum, the change-over of the shunting circuit to the outputs of the coupler being done according to a first relationship of the form $1-\cos^2(\pi t/2t_1)$ and a second relationship of the form $\cos^2(\pi-t/2t_1)$ the shunting circuit being controlled by signals with exponential fronts.

8. A radiogoniometer according to claim 7 wherein each reception channel comprises a frequency-changing device coupled to the intermediate frequency amplifier through an intermediate frequency filter.

9. A radiogoniometer according to claim 8 wherein the attenuator is placed at the input of each of the reception channels and wherein the pulse generator is controlled by the processing unit, at a determined instant preceding the instant at which the antennas and the conversion and shunting circuits are changed over.

10. A radiogoniometer according to claim 9 wherein the intermediate frequency amplifier of each reception channel comprises an automatic control loop comprising a current switch coupled to a capacitor, the current switch being controlled by the processing unit to memorize the gain of the intermediate frequency amplifier before the instant at which the antennas and conversion and shunting circuits are changed over.

* * * * *